United States Patent
Miglani et al.

(10) Patent No.: US 9,716,514 B2
(45) Date of Patent: Jul. 25, 2017

(54) DELTA SIGMA MODULATOR WITH MODIFIED DWA BLOCK

(71) Applicant: Texas Instruments Incorporated, Dallas, TX (US)

(72) Inventors: Eeshan Miglani, Chhindwara (IN); Karthikeyan Gunasekaran, Chennai (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/160,116

(22) Filed: May 20, 2016

(65) Prior Publication Data

US 2016/0344404 A1 Nov. 24, 2016

(30) Foreign Application Priority Data

May 22, 2015 (IN) .............. 2559/CHE/2015

(51) Int. Cl.
- *H03M 3/00* (2006.01)
- *H03M 1/06* (2006.01)
- *H03M 1/66* (2006.01)

(52) U.S. Cl.
CPC .......... *H03M 3/464* (2013.01); *H03M 1/0665* (2013.01); *H03M 1/66* (2013.01); *H03M 3/424* (2013.01)

(58) Field of Classification Search
CPC ........ H03M 3/45; H03M 3/452; H03M 3/352; H03M 3/372; H03M 3/464; H03M 3/424; H03M 3/388; H03M 3/502; H03M 1/74; H03M 1/66; H03M 1/08; H03M 1/806; H03M 1/0665; H03M 1/745; H03M 1/747

USPC .................................................. 341/140–154
See application file for complete search history.

(56) References Cited

U.S. PATENT DOCUMENTS

| | | | | |
|---|---|---|---|---|
| 6,037,888 A * | 3/2000 | Nairn | ..................... | H03M 1/687 341/145 |
| 6,642,873 B1 * | 11/2003 | Kuang | .................. | H03M 3/424 341/143 |
| 6,674,381 B1 * | 1/2004 | Gomez | ................. | H03M 3/328 341/143 |
| 7,183,955 B1 * | 2/2007 | Shih | ..................... | H03M 1/0665 341/143 |
| 7,551,088 B2 * | 6/2009 | Findlay | ................. | G01S 13/825 235/383 |

(Continued)

*Primary Examiner* — Lam T Mai
(74) *Attorney, Agent, or Firm* — John R. Pessetto; Charles A. Brill; Frank D. Cimino (57) ABSTRACT

The disclosure provides a delta sigma modulator. The delta sigma modulator includes a summer. The summer generates an error signal in response to an input signal and a feedback signal. A loop filter is coupled to the summer and generates a filtered signal in response to the error signal. A quantizer is coupled to the loop filter and generates a quantized output signal in response to the filtered signal. A digital to analog converter (DAC) is coupled to the summer, and generates the feedback signal in response to a plurality of selection signals. A modified data weighted averaging (DWA) block is coupled between the quantizer and the DAC. The modified DWA block receives a clock signal and generates the plurality of selection signals in response to the quantized output signal and a primary coefficient. The primary coefficient varies with the clock signal.

20 Claims, 3 Drawing Sheets

(56) References Cited

U.S. PATENT DOCUMENTS

| | | | | |
|---|---|---|---|---|
| 7,561,088 B1 * | 7/2009 | Ferguson | ............ | H03M 1/0665 |
| | | | | 341/143 |
| 2007/0109164 A1 * | 5/2007 | Arias | .................... | H03M 3/388 |
| | | | | 341/143 |
| 2012/0212361 A1 * | 8/2012 | Lai | ........................... | H03K 5/24 |
| | | | | 341/143 |
| 2013/0268572 A1 * | 10/2013 | Han | ........................ | G06F 17/10 |
| | | | | 708/445 |
| 2014/0301253 A1 * | 10/2014 | Obata | ................ | H03M 1/0665 |
| | | | | 370/278 |

* cited by examiner

DELTA SIGMA MODULATOR WITH MODIFIED DWA BLOCK

CROSS REFERENCES TO RELATED APPLICATIONS

This application claims priority from India provisional patent application No. 2559/CHE/2015 filed on May 22, 2015 which is hereby incorporated by reference in its entirety.

TECHNICAL FIELD

The disclosure relates to Delta Sigma Modulator (DSM) and more particularly to use of a modified data weighted averaging (DWA) block in the Delta Sigma Modulator (DSM).

BACKGROUND

Most electrical systems are digital today and hence require analog-to-digital converters (ADCs) to interface to the outside world. The outside world can either be real world signals such as temperature, pressure, voice, etc., or modulated carriers transmitting information over some medium (analog or digital communication). For all applications, energy efficiency is extremely important and more so for battery operated systems.

Delta sigma modulators are widely used for high resolution, low speed ADCs as well as for medium resolution, high speed ADCs. Delta sigma modulators have high dynamic range which makes them robust for communication and signal processing areas. It is important to use a multi-bit delta sigma modulator to fulfill demand for higher resolution, wider bandwidth and low quantization noise power. A digital to analog converter (DAC) is used in a feedback path of the delta sigma modulator. The DAC includes multiple DAC elements. A major drawback of the multi-bit delta sigma modulator is non-linearity stemming from the mismatching between the DAC elements.

The mismatching between the DAC elements can be due to manufacturing variations, material imperfections, process, voltage and temperature (PVT) variations and similar other factors. This mismatch causes non-linearity in the feedback path of the delta sigma modulator, and results in distortion and noise at an output of the delta sigma modulator.

SUMMARY

An embodiment provides a delta sigma modulator. The delta sigma modulator includes a summer. The summer generates an error signal in response to an input signal and a feedback signal. A loop filter is coupled to the summer and generates a filtered signal in response to the error signal. A quantizer is coupled to the loop filter and generates a quantized output signal in response to the filtered signal. A digital to analog converter (DAC) is coupled to the summer, and generates the feedback signal in response to a plurality of selection signals. A modified data weighted averaging (DWA) block is coupled between the quantizer and the DAC. The modified DWA block receives a clock signal and generates the plurality of selection signals in response to the quantized output signal and a primary coefficient. The primary coefficient varies with the clock signal.

DETAILED DESCRIPTION OF THE EMBODIMENTS

Figure 1:
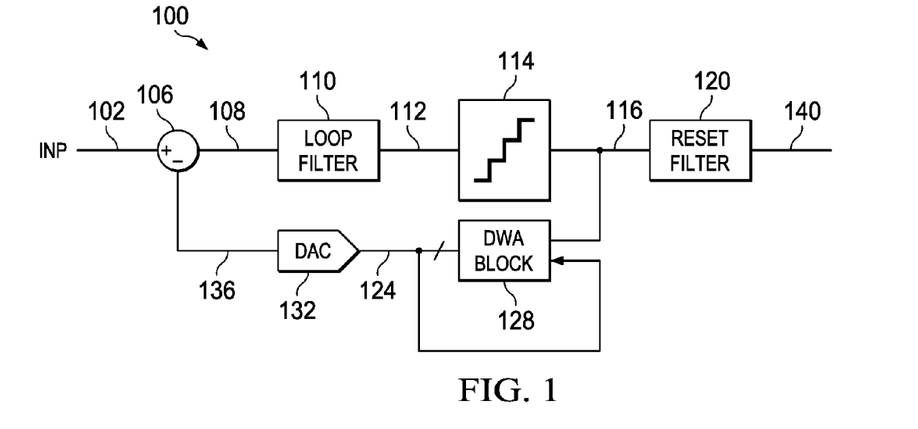
FIG. 1 is a block diagram illustrating an example delta sigma modulator in which several aspects of the present invention can be implemented.

FIG. 1 is a block diagram illustrating an example delta sigma modulator 100 in which several aspects of the present invention can be implemented. The delta sigma modulator 100 includes a summer 106, a loop filter 110, a quantizer 114, a reset filter 120, a data weighted averaging (DWA) block 128 and a digital to analog converter (DAC) 132. The summer 106 receives an input signal INP 102 and a feedback signal 136. The loop filter 110 is coupled to the summer 106. The quantizer 114 is coupled to the loop filter 110, and the reset filter 120 is coupled to the quantizer 114. The DAC 132 is coupled to the summer 106. The DWA block 128 is coupled between the quantizer 114 and the DAC 132. The delta sigma modulator 100 may include one or more additional components known to those skilled in the relevant art and are not discussed here for simplicity of the description.

The operation of the delta sigma modulator 100 illustrated in FIG. 1 is explained now. The delta sigma modulator 100 is clocked by a clock signal (not shown). The summer 106 generates an error signal 108 in response to the input signal INP 102 and the feedback signal 136. In one example, the summer 106 subtracts the feedback signal 136 from the input signal INP 102 to generate the error signal 108. The loop filter 110 generates a filtered signal 112 in response to the error signal 108. The quantizer 114 generates a quantized output signal 116 in response to the filtered signal 112. In one example, the quantizer 114 is a multi-bit quantizer.

The quantized output signal 116 is a digital code. The DAC 132 generates the feedback signal 136 in response to a plurality of selection signals 124. The DWA block 128 receives the clock signal. The DWA block 128 generates the plurality of selection signals 124 in response to the quantized output signal 116. The DWA block 128 also receives the plurality of selection signals 124 as feedback. The DAC 132 includes a plurality of DAC elements. Each DAC element of the plurality of DAC elements is activated by a selection signal of the plurality of selection signals.

A number of DAC elements in the DAC 132 are proportional to a number of bits in the quantized output signal 116. The DAC 132 generates the feedback signal 136 in response to the plurality of selection signals 124. The reset filter 120 receives the quantized output signal 116 and generates a digital output signal 140. The reset filter 120 includes a plurality of filter coefficients. The digital output signal 140 is generated from the quantized output signal 116 and the plurality of filter coefficients.

In one example, the clock signal includes a first clock cycle and a second clock cycle. A first quantized output signal is generated by the quantizer 114 at the first clock cycle, and a second quantized output signal is generated by the quantizer 114 at the second clock cycle. The reset filter 120 sums a product of the first quantized output signal and a first filter coefficient and a product of the second quantized output signal and a second filter coefficient to generate the digital output signal 140. The plurality of filter coefficients includes the first filter coefficient and the second filter coefficient.

Figure 2:
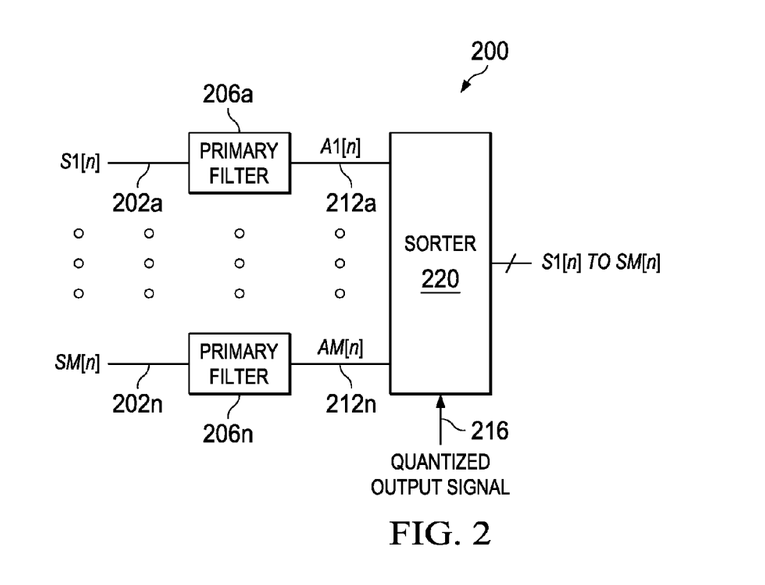
FIG. 2 illustrates architecture of a conventional data weighted averaging (DWA) block.

FIG. 2 illustrates architecture of a conventional data weighted averaging (DWA) block 200. In one version, the DWA block 200 is part of a delta sigma modulator. In another version, the DWA block 200 is similar to the DWA block 128 (illustrated in FIG. 1), in connection and operation. The operation of the DWA block 200 is explained in connection with the delta sigma modulator 100. The DWA block 200 includes a plurality of primary filters represented as 206a to 206n and a sorter 220. The sorter 220 also receives a quantized output signal 216 similar to the quantized output signal 116 illustrated in FIG. 1. The sorter 220 generates a plurality of selection signals represented as S1[n] 202a to SM[n] 202n.

Each primary filter of the plurality of primary filters 206a to 206n receives a selection signal of the plurality of selection signals S1[n] 202a to SM[n] 202n. For example, the primary filter 206a receives the selection signal S1[n] 202a, and the primary filter 206n receives the selection signal SM[n] 202n. The plurality of primary filters 206a to 206n generates a plurality of element selector signals represented as A1[n] 212a to AM[n] 212n in response to the plurality of selection signals S1[n] 202a to SM[n] 202n. For example, the primary filter 206a generates the element selector signal A1[n] 212a in response to the selection signal S1[n] 202a, and the primary filter 206n generates the element selector signal AM[n] 212n in response to the selection signal SM[n] 202n.

The sorter 220 sorts the plurality of element selector signals A1[n] 212a to AM[n] 212n, and generates the plurality of selection signals S1[n] 202a to SM[n] 202n. The sorter 220, in one example, selects element selector signals whose magnitude is lower of all the plurality of element selector signals A1[n] 212a to AM[n] 212n, and generates these as selection signals. A number of selection signals generated by the sorter 220 is based on the quantized output signal 216.

For example, the sorter 220 receives 10 element selector signals. The sorter 220 sorts these 10 element selector signals. The quantized output signal 216 is a digital code, for example 2. The sorter 220 selects the lowest two element selector signals out of the 10 element selector signals, and generates them as selection signals.

Each selection signal of the plurality of selection signals S1[n] 202a to SM[n] 202n corresponds to a DAC element in the DAC for example DAC 132. Each selection signal activates a DAC element in the DAC. The operation of the DWA block 200 is further explained in connection with Table 1.

TABLE 1

| | Clock cycle | | | | | | |
|---|---|---|---|---|---|---|---|
| | 1 | 2 | 3 | | 6 | 7 | 8 |
| Reset Filter coefficients | 0.5 | 0.3 | 0.2 | Reseting Sigma Delta | 0.5 | 0.3 | 0.2 |

TABLE 1-continued

| | Clock cycle | | | | | | |
|---|---|---|---|---|---|---|---|
| | 1 | 2 | 3 | | 6 | 7 | 8 |
| Quantized output signal | 1 | 1 | 2 | Modulator | 1 | 2 | 2 |
| A1[n] | 0 | 1 | 1 | | 2 | 2 | 3 |
| A2[n] | 0 | 0 | 1 | | 1 | 2 | 2 |
| A3[n] | 0 | 0 | 0 | | 1 | 1 | 2 |
| S1[n] | 1 | 0 | 1 | | 0 | 1 | 0 |
| S2[n] | 0 | 1 | 0 | | 1 | 0 | 1 |
| S3[n] | 0 | 0 | 1 | | 0 | 1 | 1 |
| Error at DAC output | 0.1 | −0.05 | 0.05 | | −0.05 | 0.05 | −0.1 |
| Net error in Digital output Signal | | 0.045 | | | | −0.03 | |

The table 1 illustrates that the clock signal received by the delta sigma modulator 100 has multiple clock cycles. For the purpose of representation, 8 clock cycles have been illustrated in the above table. The coefficients of the reset filter 120 are given as 0.5, 0.3 and 0.2. These numbers are for illustration, and the reset filter 120 can have one or more filter coefficients. When the delta sigma modulator 100 is initialized (clock cycle is 1), the quantized output signal 216 is 1. At initialization, the element selector signals A1[n], A2[n] and A3[n] are all zero. One selection line S1[n] is selected, since the quantized output signal 216 is 1.

It is assumed, that the selection line S1[n] corresponds to a first DAC element, the selection line S2[n] corresponds to a second DAC element, and the selection line S3[n] corresponds to a third DAC element. The first DAC element has a mismatch error of 0.1, the second DAC element has a mismatch error of −0.05 and the third DAC element has a mismatch error of −0.05. Since, at first clock cycle, the selection line S1[n] is selected which activates the first DAC element, an error of 0.1 is introduced in an output of the DAC 132 or in the feedback signal 136.

Similarly, at clock cycle 2, the quantized output signal is 1. The element selector signal A1[n] is 1 since the selection line S1[n] has been selected once at the first clock cycle, while the element selector signals A2[n] and A3[n] are zero, since none of the selection lines S2[n] and S3[n] have been selected. Hence, any of the selection lines S2[n] and S3[n] can be selected. The table illustrates that the selection line S2[n] is selected which activates the second DAC element. Hence, the error of −0.05 is introduced at the output of the DAC 132.

At clock cycle 3, the quantized output signal is 2, which implies that two selection lines are to be selected. The element selector signal A1[n] is 1 since the selection line S1[n] has been selected once at the first clock cycle. Similarly, the element selector signal A2[n] is one since the selection line S2[n] has been selected in the second clock cycle. The selection line S3[n] is zero since the selection line S3[n] has not been selected earlier. Hence, S3[n] is selected and either one of S1[n] and S2[n] can be selected. The error at the output of the DAC 132 is sum of 0.1 and −0.05 which equals 0.05.

After third clock cycle, the delta sigma modulator is reset, but the DWA block 200 maintains history of previous clock cycles, for example, clock cycles 1 to 3.

At sixth clock cycle, the quantized output signal is 1 which implies only one selection line can be selected. The element selector signal A1[n] is 2 since the selection line S1[n] has been selected at the first clock cycle and at the third clock cycle. The element selector signal A2[n] is 1 since the selection line S2[n] has been selected once at the second clock cycle. The element selector signal A3[n] is 1 since the selection line S3[n] has been selected once in the third clock cycle.

Since, A2[n] and A3[n] are minimum of all the element selector signals, either of these can be selected since the quantized output signal is 1. The selection line S2[n] is selected which activates the second DAC element. Hence, the error of −0.05 is introduced in the output of the DAC 132. An error because of a DAC element proportionately affects the quantized output signal 116. The error in the quantized output signal 116 after passing through the reset filter 120 produces a net error in the digital output signal 140. The net error in the digital output signal 140 during clock cycles 1 to 3 is given as:

$$\text{Net Error}=0.5*0.1+0.3*-0.05+0.2*0.05=0.045 \qquad (1)$$

Similarly, the net error in the digital output signal 140 during clock cycles 4 to 6 is given as:

$$\text{Net Error}=0.5*-0.05+0.3*0.05+0.2*-0.1=-0.03 \qquad (2)$$

The digital output signal 140 suffers from the noise introduced by the reset filter 120. This is also illustrated in equations 1 and 2. Also, when the input signal INP 102 is a burst of N cycles, where N is an integer, the mismatch between the DAC elements become periodic resulting in-band aliasing tones. Hence, the noise introduced in the digital output signal 140 severely impacts operation of the delta sigma modulator 100.

Figure 3:
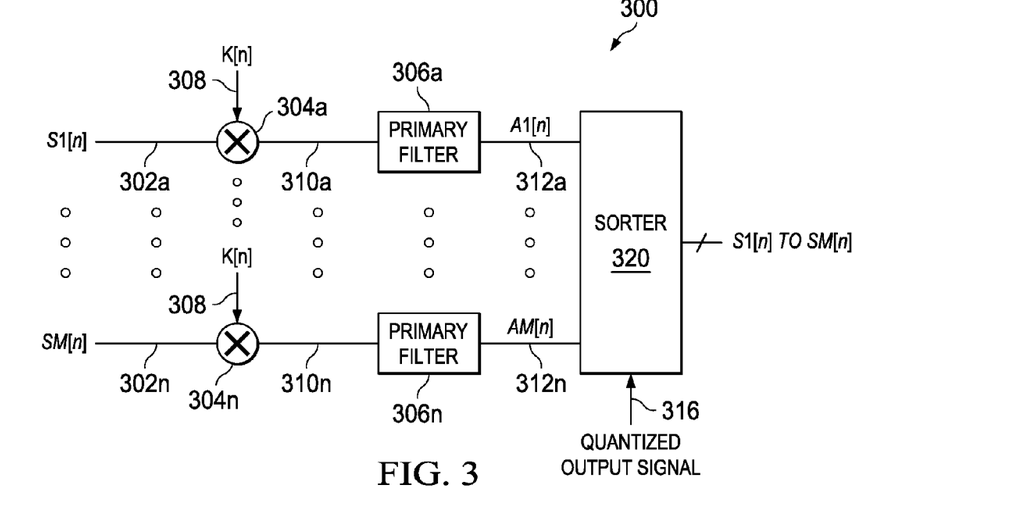
FIG. 3 illustrates architecture of a modified data weighted averaging (DWA) block, according to an embodiment.

FIG. 3 illustrates architecture of a modified data weighted averaging (DWA) block 300, according to an embodiment. The modified DWA block 300 is similar to the DWA block 128, illustrated in FIG. 1, in connection and operation. The operation of the modified DWA block 300 is explained in connection with the delta sigma modulator 100. The modified DWA block 300 includes a plurality of multipliers represented as 304a to 304n.

The modified DWA block 300 also includes a plurality of primary filters represented as 306a to 306n and a sorter 320. The plurality of primary filters 306a to 306n is coupled to the plurality of multipliers 304a to 304n. Each primary filter of the plurality of primary filters 306a to 306n is coupled to a multiplier of the plurality of multipliers 304a to 304n. For example, the primary filter 306a is coupled to the multiplier 304a, and the primary filter 306n is coupled to the multiplier 304n. The sorter 320 is coupled to the plurality of primary filters 306a to 306n.

The sorter 320 also receives the quantized output signal 316. The quantized output signal 316 is similar to the quantized output signal 116 illustrated in FIG. 1. The sorter 320 generates a plurality of selection signals represented as S1[n] 302a to SM[n] 302n. Each multiplier of the plurality of multipliers receives a selection signal and a primary coefficient K[n] 308. For example, the multiplier 304a receives the selection signal S1[n] 302a and the primary coefficient K[n] 308. Similarly, the multiplier 304n receives the selection signal SM[n] 302n and the primary coefficient K[n] 308.

The modified DWA block 300 may include one or more additional components known to those skilled in the relevant art and are not discussed here for simplicity of the description.

The operation of the modified DWA block 300 illustrated in FIG. 3 is explained now. Each multiplier multiplies a selection signal of the plurality of selection signals 302a to 302n and the primary coefficient K[n] 308 to generate an intermediate signal of the plurality of intermediate signals 310a to 310n. For example, the multiplier 304a multiplies the selection signal S1[n] and the primary coefficient K[n] 308 to generate an intermediate signal 310a. The modified DWA block 300, similar to the DWA block 128, receives a clock signal.

The primary coefficient K[n] 308 varies with the clock signal. In one example, the primary coefficient K[n] 308 at a clock signal is derived from a plurality of filter coefficients in the reset filter 120. In one example, when a first quantized output signal is generated at a first clock cycle by the quantizer 114, the primary coefficient K[n] 308 used in the modified DWA block is equal to a first filter coefficient of the plurality of filter coefficients. In yet another example, the primary coefficient K[n] 308 is derived from the plurality of filter coefficients in the reset filter 120 and a transfer function from feedback signal 136 to the quantized output signal 116.

The plurality of primary filters 306a to 306n generate a plurality of element selector signals represented as A1[n] 312a to AM[n] 312n in response to the plurality of intermediate signals 310a to 310n. For example, the primary filter 306a generates the element selector signal A1[n] 312a in response to the intermediate signal 310a. Similarly, the primary filter 306n generates the element selector signal AM[n] 312n in response to the intermediate signal 310n.

The sorter 320 sorts the plurality of element selector signals A1[n] 312a to AM[n] 312n to generate the plurality of selection signals S1[n] 302a to SM[n] 302n. The sorter 320, in one example, selects element selector signals whose magnitude is lower of all the plurality of element selector signals A1[n] 312a to AM[n] 312n, and generates these as selection signals.

A number of selection signals generated by the sorter 320 is based on the quantized output signal 316. For example, the sorter 320 receives 10 element selector signals. The sorter 320 sorts these 10 element selector signals. The quantized output signal 316 is a digital code, for example 2. The sorter 320 selects the lowest two element selector signals out of the 10 element selector signals, and generates them as selection signals.

Each selection signal of the plurality of selection signals S1[n] 302a to SM[n] 302n corresponds to a DAC element in the DAC 132. Each selection signal activates a DAC element in the DAC 132. A number of DAC elements in the DAC 132 are proportional to a number of bits in the quantized output signal 316. The operation of the modified DWA block 300 is further explained in connection with Table 2.

TABLE 2

| | Clock cycle | | | | | | |
|---|---|---|---|---|---|---|---|
| | 1 | 2 | 3 | | 6 | 7 | 8 |
| Reset Filter coefficients | 0.5 | 0.3 | 0.2 | Reseting Sigma Delta Modulator | 0.5 | 0.3 | 0.2 |
| Quantized output signal | 1 | 1 | 2 | | 1 | 2 | 2 |
| A1[n] | 0 | 0.5 | 0.5 | | 0.5 | 0.5 | 0.8 |
| A2[n] | 0 | 0 | 0.3 | | 0.5 | 0.5 | 0.8 |
| A3[n] | 0 | 0 | 0 | | 0.2 | 0.7 | 0.7 |
| S1[n] | 1 | 0 | 0 | | 0 | 1 | 1 |
| S2[n] | 0 | 1 | 1 | | 0 | 1 | 0 |

TABLE 2-continued

| | Clock cycle | | | | | | |
|---|---|---|---|---|---|---|---|
| | 1 | 2 | 3 | | 6 | 7 | 8 |
| S3[n] | 0 | 0 | 1 | | 1 | 0 | 1 |
| Error at DAC output | 0.1 | −0.05 | −0.1 | | −0.05 | 0.05 | 0.05 |
| Net error in Digital output Signal | | 0.015 | | | | 0 | |

The table 2 illustrates that the clock signal received by the delta sigma modulator 100 has multiple clock cycles. For the purpose of representation, 8 clock cycles have been illustrated in the above table. The coefficients of the reset filter 120 are given as 0.5, 0.3 and 0.2. These numbers are for illustration, and the reset filter 120 can have one or more filter coefficients. When the delta sigma modulator 100 is initialized (clock cycle is 1), the quantized output signal 316 is 1. At initialization, the element selector signals A1[$n$], A2[$n$] and A3[$n$] are all zero. One selection line S1[$n$] is selected, since the quantized output signal 316 is 1.

It is assumed, that the selection line S1[$n$] corresponds to a first DAC element, the selection line S2[$n$] corresponds to a second DAC element, and the selection line S3[$n$] corresponds to a third DAC element. The first DAC element has a mismatch error of 0.1, the second DAC element has a mismatch error of −0.05 and the third DAC element has a mismatch error of −0.1. Since, at first clock cycle, the selection line S1[$n$] is selected which activates the first DAC element, an error of 0.1 is introduced in an output of the DAC 132.

Similarly, at clock cycle 2, the quantized output signal is 1. The element selector signal Ai[n] is calculated from a previous value of Ai[n] and a multiplication of Si[n−1] and the primary coefficient K[n] 308. Thus, Ai[n] is defined as:

$$Ai[n]=Ai[n-1]+Si[n-1]*K[n] \tag{3}$$

The primary coefficient K[n] 308 is derived from a plurality of filter coefficients associated with the reset filter 120. Here, in the table 2, it is assumed that the primary coefficient K[n] 308 is equal to the filter coefficient of the reset filter 120 at a clock cycle. A value of the primary coefficient K[n] 308 used in table 2, is the value of the filter coefficient for which Si[n−1] is generated. For example, at clock cycle 2, the value of K[n] is equal to 0.5 as this is the filter coefficient when the selection signal S1[$n$−1] is generated. Hence, at clock cycle 2, the element selector signal A1[$n$] is given as:

$$A1[n]=0+1*0.5=0.5 \tag{4}$$

In another example, the element selector signal represents in-band component of the DAC element selection sequence. The element selector signals A2[$n$] and A3[$n$] are zero when calculated using equation 3. Hence, any of the selection lines S2[$n$] and S3[$n$] can be selected. The table illustrates that the selection line S2[$n$] is selected which activates the second DAC element. Hence, the error of −0.05 is introduced at the output of the DAC 132.

At clock cycle 3, the quantized output signal is 2, which implies that two selection lines are to be selected. The element selector signals are calculated using equation 3, and given below:

$$A1[n]=0.5+0*0.3=0.5 \tag{5}$$

$$A2[n]=0+1*0.3=0.3 \tag{6}$$

$$A3[n]=0+0*0.3=0 \tag{7}$$

Since, A2[$n$] and A3[$n$] are minimum of the element selector signals, the selection lines S2[$n$] and S3[$n$] are selected. The error at the output of the DAC 132 is sum of −0.05 and −0.05 which equals −0.1.

After third clock cycle, the delta sigma modulator is reset, but the modified DWA block 300 maintains history of previous clock cycles, for example, clock cycles 1 to 3.

At sixth clock cycle, the quantized output signal is 1 which implies only one selection line can be selected. The element selector signals are calculated using equation 3, and given below:

$$A1[n]=0.5+0*0.2=0.5 \tag{8}$$

$$A2[n]=0.3+1*0.2=0.5 \tag{9}$$

$$A3[n]=0+1*0.2=0.2 \tag{10}$$

Since, A3[$n$] is minimum of all the element selector signals, the selection line S3[$n$] is selected. Hence, the error of −0.05 is introduced in the output of the DAC 132. A net error in the digital output signal 140 during clock cycles 1 to 3 is given as:

$$\text{Net Error}=0.5*0.1+0.3*-0.05+0.2*-0.1=0.015 \tag{11}$$

Similarly, the net error in the digital output signal 140 during clock cycles 4 to 6 is given as:

$$\text{Net Error}=0.5*-0.05+0.3*0.05+0.2*0.05=0 \tag{12}$$

Thus, the net error introduced by the modified DWA block 300 is less as compared to the net error introduced by the DWA block 200 as seen by equations 1, 2, 11 and 12.

The sorter 320 maintains that the DAC elements are activated in a predetermined order such that an average activation of all the DAC elements is equal. This ensures equal contribution of all the DAC elements in the quantized output signal 316 generated by the quantizer 114 in the delta sigma modulator 100. This reduces non-linearity stemming from the mismatch between the DAC elements. In addition, the modified DWA block 300 effectively tackles the noise introduced by the reset filter 120. The multiplication of the primary coefficient K[n] 308 with the selection signals provide for cancellation of the noise introduced by the reset filter 120.

Figure 4:
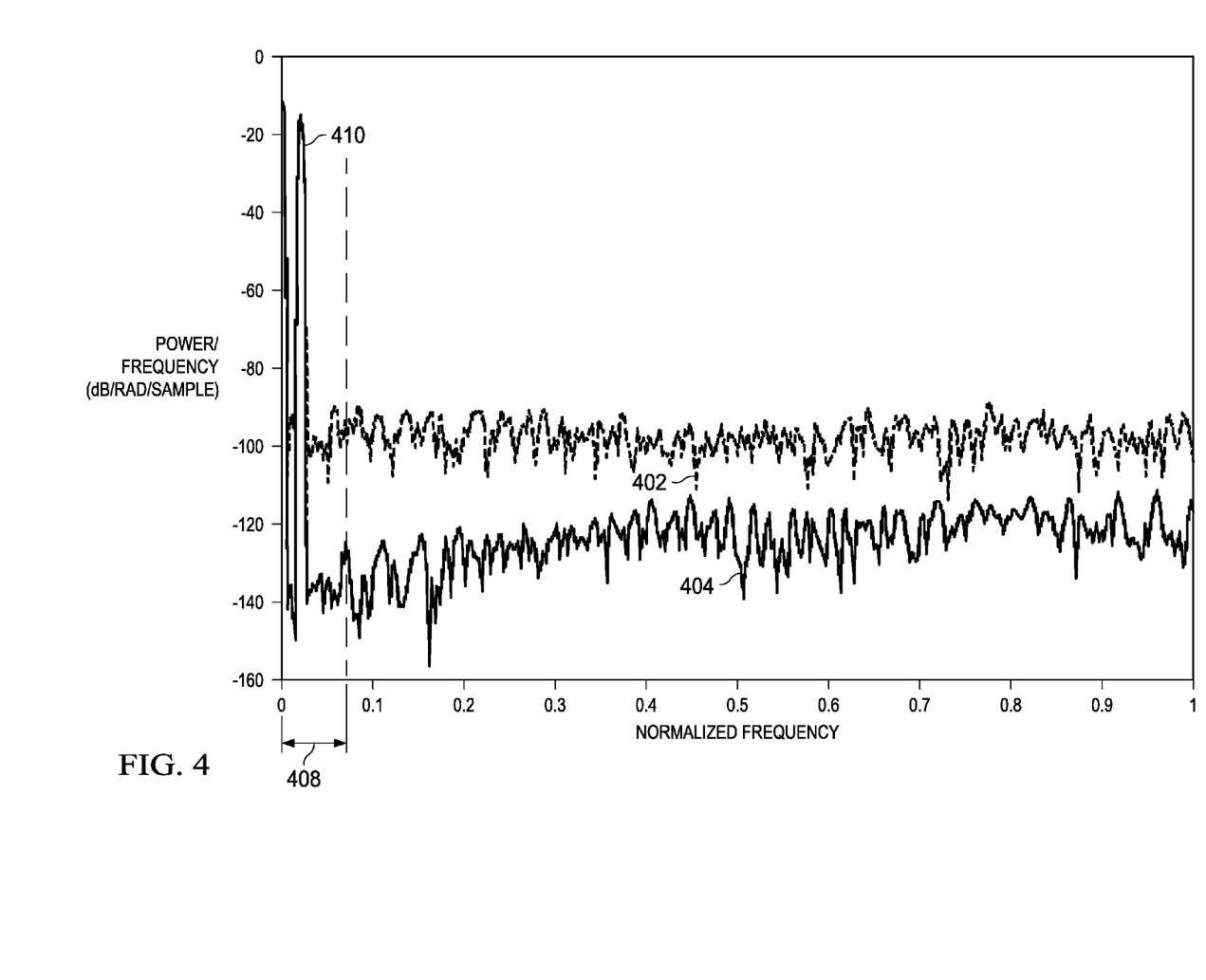
FIG. 4 illustrates output frequency spectrum of a delta sigma modulator, according to an embodiment.

FIG. 4 illustrates output frequency spectrum of a delta sigma modulator, according to an embodiment. A curve 402 represents an output frequency spectrum of the delta sigma modulator 100 when the DWA block 200 is used. A curve 404 represents an output frequency spectrum of the delta sigma modulator 100 when the modified DWA block 300 is used. It is observed that noise introduced by the modified DWA block 300 is much lesser than the DWA block 200.

The peak 410 represents the digital output signal 140 generated by the delta sigma modulator 100. A region 408 represents a band of interest. The noise introduced by the modified DWA block 300 in the band of interest 408 is much lesser as compared to the noise introduce by the DWA block 200. The modified DWA block 300 provides for multiplication of a primary coefficient with the selection signals which provide for cancellation of the noise introduced by the reset filter 120. The primary coefficient varies with the clock signal. In one version, the primary coefficient at a clock signal is derived from a plurality of filter coefficients associated with the reset filter 120.

Figure 5:
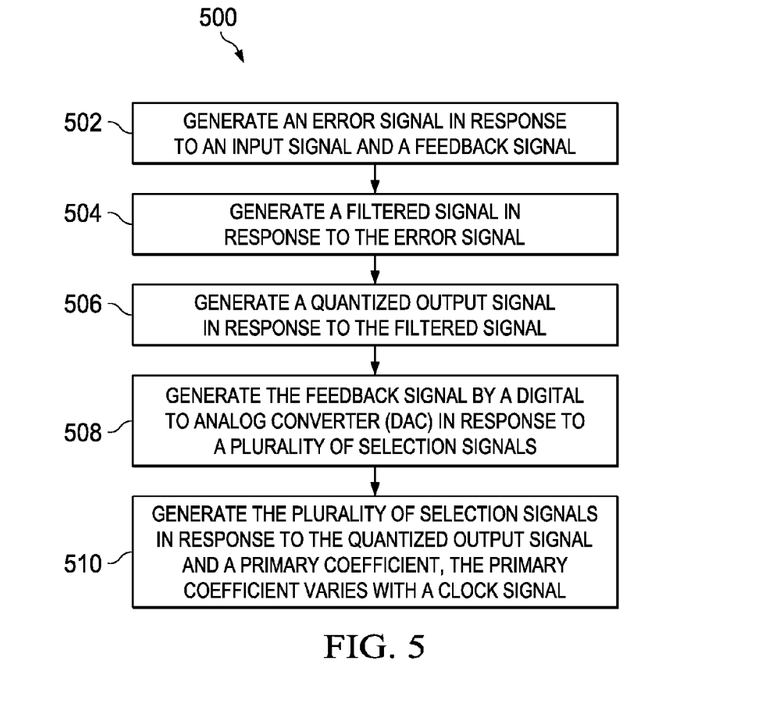
FIG. 5 is a flowchart to illustrate a method of operation of a delta sigma modulator, according to an embodiment.

FIG. 5 is a flowchart 500 to illustrate a method of operation of a delta sigma modulator, according to an embodiment. The flowchart 500 is explained in connection with the delta sigma modulator 100 and the modified DWA block 300. At step 502, an error signal is generated in response to an input signal and a feedback signal. For example, in the delta sigma modulator 100, the summer 106 generates an error signal 108 in response to the input signal INP 102 and the feedback signal 136. In one example, the summer 106 subtracts the feedback signal 136 from the input signal INP 102 to generate the error signal 108.

At step 504, a filtered signal is generated in response to the error signal. The loop filter 110 filters the error signal 108 in the delta sigma modulator 100 to generate the filtered signal 112. A quantized output signal is generated in response to the filtered signal, at step 506. The quantizer 114 generates a quantized output signal 116 in response to the filtered signal 112. The feedback signal is generated by a digital to analog converter (DAC) in response to a plurality of selection signals, at step 508. The DAC 132 generates the feedback signal 136 in response to a plurality of selection signals 124. At step 510, the plurality of selection signals is generated in response to the quantized output signal and a primary coefficient. The primary coefficient varies with a clock signal. For example, when the modified DWA block 300 is used in the delta sigma modulator 100, the plurality of selection signals S1[$n$] 302a to SM[n] 302n are generated in response to the quantized output signal 316 and the primary coefficient K[n] 308.

The reset filter 120 receives the quantized output signal 116 and generates the digital output signal 140. The reset filter 120 includes a plurality of filter coefficients. The digital output signal 140 is generated from the quantized output signal 116 and the plurality of filter coefficients.

In one example, the primary coefficient K[n] 308 at a clock signal is derived from a plurality of filter coefficients in the reset filter 120. In one example, the clock signal includes a first clock cycle and a second clock cycle. A first quantized output signal is generated by the quantizer 114 at the first clock cycle, and a second quantized output signal is generated by the quantizer 114 at the second clock cycle. The reset filter 120 sums a product of the first quantized output signal and a first filter coefficient and a product of the second quantized output signal and a second filter coefficient to generate the digital output signal 140. The plurality of filter coefficients includes the first filter coefficient and the second filter coefficient.

The modified DWA block 300 includes a plurality of multipliers represented as 304a to 304n. Each multiplier multiplies a selection signal of the plurality of selection signals 302a to 302n and the primary coefficient K[n] 308 to generate an intermediate signal of the plurality of intermediate signals 310a to 310n. For example, the multiplier 304a multiplies the selection signal S1[$n$] and the primary coefficient K[n] 308 to generate an intermediate signal 310a. The modified DWA block 300, similar to the DWA block 128, receives a clock signal.

The plurality of primary filters 306a to 306n generate a plurality of element selector signals represented as A1[$n$] 312a to AM[n] 312n in response to the plurality of intermediate signals 310a to 310n. For example, the primary filter 306a generates the element selector signal A1[$n$] 312a in response to the intermediate signal 310a. Similarly, the primary filter 306n generates the element selector signal AM[n] 312n in response to the intermediate signal 310n. The sorter 320 sorts the plurality of element selector signals 312a to 312n to generate the plurality of selection signals S1[$n$] 302a to SM[n] 302n.

Each selection signal of the plurality of selection signals S1[$n$] 302a to SM[n] 302n corresponds to a DAC element in the DAC 132. Each selection signal activates a DAC element in the DAC 132. In an example, when the DAC 132 includes a first set of DAC element and a second set of DAC elements, the first set of DAC elements are activated in response to the plurality of selection signals S1[$n$] 302a to SM[n] 302n and the quantized output signal 316. A number of DAC elements in the first set of DAC elements is based on the quantized output signal 316.

Thus, the delta sigma modulator with the modified DWA block 300 reduces non-linearity stemming from the mismatch between the DAC elements. In addition, the modified DWA block 300 effectively tackles the noise introduced by the reset filter 120. The multiplication of the primary coefficient K[n] 308 with the selection signals provide for cancellation of the noise introduced by the reset filter 120.

Figure 6:
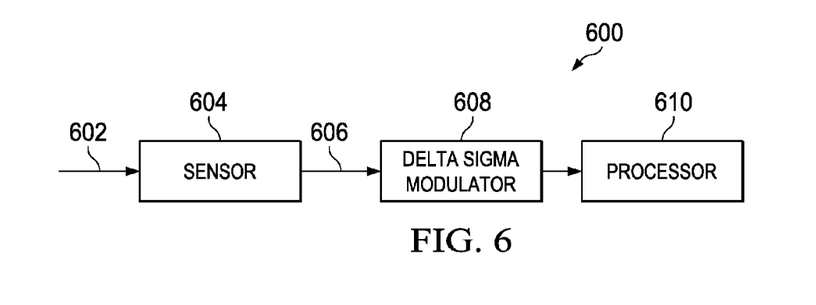
FIG. 6 is a block diagram of a device, according to an embodiment.

FIG. 6 is a block diagram of a device 600, according to an embodiment. The device 600 is, or is incorporated into, a computing device, a server, a transceiver, a communication device, or any other type of electronic system. The device 600 may include one or more additional components known to those skilled in the relevant art and are not discussed here for simplicity of the description.

The device 600 includes a sensor 604, a delta sigma modulator 608 and a processor 610. The sensor 604 receives a real-world signal 602. The real-world signal 602 can be at least one of the following, but not limited to, a vibration signal, a temperature signal, a pressure signal and the like. The sensor 604 generates an input signal 606 in response to the real-world signal 602. The delta sigma modulator 608 is coupled between the sensor 604 and the processor 610. The delta sigma modulator 608 generates a digital output signal in response to the input signal 606. The processor 610 processes the digital output signal.

The processor 610 can be, for example, a CISC-type (Complex Instruction Set Computer) CPU, RISC-type CPU (Reduced Instruction Set Computer), or a digital signal processor (DSP). The processor 610 can include a memory which can be memory such as RAM, flash memory, or disk storage. The delta sigma modulator 608 is similar to the delta sigma modulator 100 with the modified DWA block 300.

The modified DWA block 300 reduces non-linearity stemming from the mismatch between the DAC elements. In addition, the modified DWA block 300 effectively tackles the noise introduced by a reset filter in the delta sigma modulator 608. The delta sigma modulator provides for multiplication of a primary coefficient with the selection signals in the modified DWA block 300. This results in cancellation of the noise introduced by the reset filter.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A delta sigma modulator comprising:
   a summer configured to generate an error signal in response to an input signal and a feedback signal;
   a loop filter coupled to the summer and configured to generate a filtered signal in response to the error signal;
   a quantizer coupled to the loop filter and configured to generate a quantized output signal in response to the filtered signal;

a digital to analog converter (DAC) coupled to the summer, and configured to generate the feedback signal in response to a plurality of selection signals; and a modified data weighted averaging (DWA) block coupled between the quantizer and the DAC, the modified DWA block configured to receive a clock signal and configured to generate the plurality of selection signals in response to the quantized output signal and a primary coefficient, wherein the primary coefficient varies with the clock signal.

2. The delta sigma modulator of claim 1, wherein a first quantized output signal is generated at a first clock cycle and a second quantized output signal is generated at a second clock cycle, wherein the clock signal comprises the first clock cycle and the second clock cycle.

3. The delta sigma modulator of claim 1 further comprising a reset filter coupled to the quantizer and configured to generate a digital output signal in response to the quantized output signal and a plurality of filter coefficients.

4. The delta sigma modulator of claim 3, wherein a primary coefficient at a clock signal is derived from the plurality of filter coefficients.

5. The delta sigma modulator of claim 3, wherein the reset filter is configured to sum a product of the first quantized output signal and a first filter coefficient and a product of the second quantized output signal and a second filter coefficient to generate the digital output signal, wherein the plurality of filter coefficients comprises the first filter coefficient and the second filter coefficient.

6. The delta sigma modulator of claim 1, wherein the modified DWA block comprises:

a plurality of multipliers configured to generate a plurality of intermediate signals, each multiplier configured to multiply a selection signal of the plurality of selection signals and the primary coefficient to generate an intermediate signal of the plurality of intermediate signals;

a plurality of primary filters coupled to the plurality of multipliers, each primary filter coupled to a multiplier of the plurality of multipliers, the plurality of primary filters configured to generate a plurality of element selector signals in response to the plurality of intermediate signals; and a sorter coupled to the plurality of primary filters, and configured to sort the plurality of element selector signals to generate the plurality of selection signals.

7. The delta sigma modulator of claim 6, wherein a number of selection signals of the plurality of selection signals generated by the modified DWA block is based on the quantized output signal.

8. The delta sigma modulator of claim 6, wherein when the quantized output signal is the first quantized output signal generated at the first clock cycle, the primary coefficient is equal to the first filter coefficient.

9. The delta sigma modulator of claim 1, wherein the DAC comprises a plurality of DAC elements, each DAC element of the plurality of DAC elements configured to be activated by a selection signal of the plurality of selection signals.

10. The delta sigma modulator of claim 9, wherein a number of DAC elements in the DAC are proportional to a number of bits in the quantized output signal.

11. The delta sigma modulator of claim 9, wherein an element selector signal of the plurality of element selector signals represents in-band component of DAC element selection sequence.

12. A method comprising:

generating an error signal in response to an input signal and a feedback signal;

generating a filtered signal in response to the error signal;

generating a quantized output signal in response to the filtered signal;

generating the feedback signal by a digital to analog converter (DAC) in response to a plurality of selection signals; and generating the plurality of selection signals in response to the quantized output signal and a primary coefficient, wherein the primary coefficient varies with a clock signal.

13. The method of claim 12 further comprising generating a first quantized output signal at a first clock cycle, and generating a second quantized output signal at a second clock cycle, wherein the clock signal comprises the first clock cycle and the second clock cycle.

14. The method of claim 12 further comprising generating a digital output signal in response to the quantized output signal and a plurality of filter coefficients.

15. The method of claim 14, wherein a primary coefficient at a clock signal is derived from the plurality of filter coefficients.

16. The method of claim 14 further comprising summing a product of the first quantized output signal and a first filter coefficient and a product of the second quantized output signal and a second filter coefficient to generate the digital output signal, wherein the plurality of filter coefficients comprises the first filter coefficient and the second filter coefficient.

17. The method of claim 12, wherein generating the feedback signal further comprises:

generating a plurality of intermediate signals, an intermediate signal of the plurality of intermediate signals is generated by multiplying a selection signal of the plurality of selection signals and the primary coefficient;

generating a plurality of element selector signals in response to the plurality of intermediate signals;

sorting the plurality of element selector signals to generate the plurality of selection signals; and activating a first set of DAC elements in the DAC in response to the plurality of selection signals, wherein the DAC includes the first set of DAC element and a second set of DAC elements.

18. The method of claim 17, wherein a number of DAC elements in the first set of DAC elements is based on the quantized output signal.

19. A device comprising:

a sensor configured to generate an input signal in response to a real-world signal;

a processor coupled to the sensor and configured to process a digital output signal; and a delta sigma modulator coupled between the sensor and the processor and configured to generate the digital output signal, the delta sigma modulator comprising:

a summer configured to generate an error signal in response to the input signal and a feedback signal;

a loop filter coupled to the summer and configured to generate a filtered signal in response to the error signal;

a quantizer coupled to the loop filter and configured to generate a quantized output signal in response to the filtered signal;

a digital to analog converter (DAC) coupled to the summer, and configured to generate the feedback signal in response to a plurality of selection signals; and a modified data weighted averaging (DWA) block coupled between the quantizer and the DAC, the modified DWA block configured to receive a clock signal and configured to generate the plurality of selection signals in response to the quantized output signal and a primary coefficient, wherein the primary coefficient varies with the clock signal.

20. The device of claim 19, wherein the delta sigma modulator further comprises a reset filter coupled to the quantizer and configured to generate the digital output signal in response to the quantized output signal and a plurality of filter coefficients.

* * * * *